(12) United States Patent
Baik et al.

(10) Patent No.: US 7,791,130 B2
(45) Date of Patent: Sep. 7, 2010

(54) NON-VOLATILE MEMORY DEVICE AND METHODS OF FORMING THE SAME

(75) Inventors: Seung-Jae Baik, Seoul (KR); Si-Young Choi, Seongnam-si (KR); Ki-Hyun Hwang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 136 days.

(21) Appl. No.: 12/222,568

(22) Filed: Aug. 12, 2008

(65) Prior Publication Data
US 2009/0045448 A1  Feb. 19, 2009

(30) Foreign Application Priority Data
Aug. 13, 2007  (KR)  ............... 10-2007-0081300

(51) Int. Cl.
*H01L 29/792* (2006.01)
(52) U.S. Cl. ............... 257/324; 257/E29.309
(58) Field of Classification Search ......... 257/314, 257/324–326, E29.309
See application file for complete search history.

(56) References Cited

U.S. PATENT DOCUMENTS

| | | | |
|---|---|---|---|
| 6,927,446 B2 | 8/2005 | Yoshino | |
| 7,064,031 B2 * | 6/2006 | Shih | 438/264 |
| 2005/0253189 A1 | 11/2005 | Cho et al. | |
| 2006/0043468 A1 | 3/2006 | Manning et al. | |

FOREIGN PATENT DOCUMENTS

| | | |
|---|---|---|
| JP | 2003-318290 | 11/2003 |
| KR | 10-0546409 | 1/2006 |

OTHER PUBLICATIONS

English language Abstract of 10-2005-0108040 dated Nov. 16, 2005.

* cited by examiner

*Primary Examiner*—Mark Prenty
(74) *Attorney, Agent, or Firm*—Harness, Dickey & Pierce, P.L.C.

(57) ABSTRACT

Example embodiments provide a non-volatile memory device and methods of forming the same. The non-volatile memory device may define an active region in a semiconductor substrate, and may include a device isolation layer extending in a first direction, bit lines in the semiconductor substrate, the bit lines extending in a second direction which intersects the first direction; word lines extending in the first direction and covering the active region; and charge storage patterns between the word lines and active region, wherein the charge storage patterns may be in pairs on both edges of the bit lines, and a pair of charge storage patterns may be spaced apart from each other by the word lines.

10 Claims, 20 Drawing Sheets

NON-VOLATILE MEMORY DEVICE AND METHODS OF FORMING THE SAME

PRIORITY STATEMENT

This application claims priority under 35 U.S.C §119 to Korean Patent Application No. 2007-81300, filed on Aug. 13, 2007, in the Korean Intellectual Property Office (KIPO), the entire contents of which are incorporated herein by reference.

BACKGROUND

1. Field

Example embodiments are related to a semiconductor memory device and methods of forming the same, more particularly, related to a non-volatile semiconductor device and methods of forming the same.

2. Description of Related Art

Generally, a semiconductor memory device may be sorted in to a volatile memory device, where stored data dissipates when power supply is stopped, and a non-volatile memory device, which may be capable of retaining stored data when power supply is stopped. There may be a floating gate-type and a charge trap-type in a non-volatile memory device, according to a type of data storage layer which constitutes a unit cell. The floating gate-type memory device may be limited in higher integration, and may require higher power consumption. Therefore, a charge trap-type memory device is being researched.

In the related art, an example of a PROM (Programmable Read Only Memory) having charge trapping layer may be disclosed. Using a data programming and reading method, 2-bit data per memory cell may be retained. FIG. 1 illustrates a memory cell of a SONOS semiconductor memory device capable of retaining 2-bit data per memory cell of the related art.

Referring to FIG. 1, a tunnel insulation layer 20, a charge trapping layer 30, a blocking insulation layer 40, and a gate electrode 50 may be stacked sequentially on a semiconductor substrate 10. Source/drain regions 12 and 14 may be disposed on the semiconductor substrate 10 proximate to the gate electrode 50. The semiconductor memory device may store charge in charge trapping sites A and B on both ends of the charge trapping layer 30.

A migration of the charge trapped at the charge trapping layer 30 may occur. If migration of charge occurs, fluctuation in the threshold voltage may arise causing deterioration of the device reliability. In addition, interference may arise by the charge stored in the charge trapping sites A and B.

As the design rule is decreased, a short channel effect may occur, and also, a problem of shortening the distance between the charge trapping sites A and B may occur causing a decrease in the reliability of the device.

SUMMARY

Example embodiments are directed to a non-volatile memory device and methods of forming the same. In example embodiments, a non-volatile memory device may include a device isolation layer extending in a first direction, the device isolation layer defining an active region in a semiconductor substrate, a plurality of bit lines in the semiconductor substrate, the bit lines being extending in a second direction which intersects the first direction, a plurality of word lines extending in the first direction, the word lines covering the active region, and a plurality of charge storage patterns between the word lines and the active region, wherein the charge storage patterns may be in pairs on both edges of the bit lines, and a pair of the charge storage patterns may be spaced apart from each other by the word lines.

In example embodiments, a method of forming a non-volatile memory device may include forming a device isolation layer extending in a first direction, the device isolation layer defining an active region in a semiconductor substrate, forming a plurality of bit lines in the semiconductor substrate, the bit lines extending in a second direction which intersects the first direction, forming a plurality of word lines extending in the first direction, the word lines covering the active region; and forming a plurality of charge storage patterns between the word lines and the active region, wherein a pair of the charge storage patterns may be formed on both edges of the bit lines, and a pair of charge storage patterns may be spaced apart from each other by the word lines.

BRIEF DESCRIPTION OF THE DRAWINGS

Example embodiments will be more clearly understood from the following detailed description taken in conjunction with the accompanying drawings. FIGS. 2-13c represent non-limiting, example embodiments as described herein.

FIG. 2 is a plan view illustrating a cell array of a non-volatile memory device according to example embodiments.

FIGS. 3, 4 and 5 are cross-sectional views cut along lines I-I', II-II' and III-III' of FIG. 2.

FIGS. 6a to 13c are cross-sectional views illustrating methods of forming non-volatile memory devices according to example embodiments.

Figure 1:
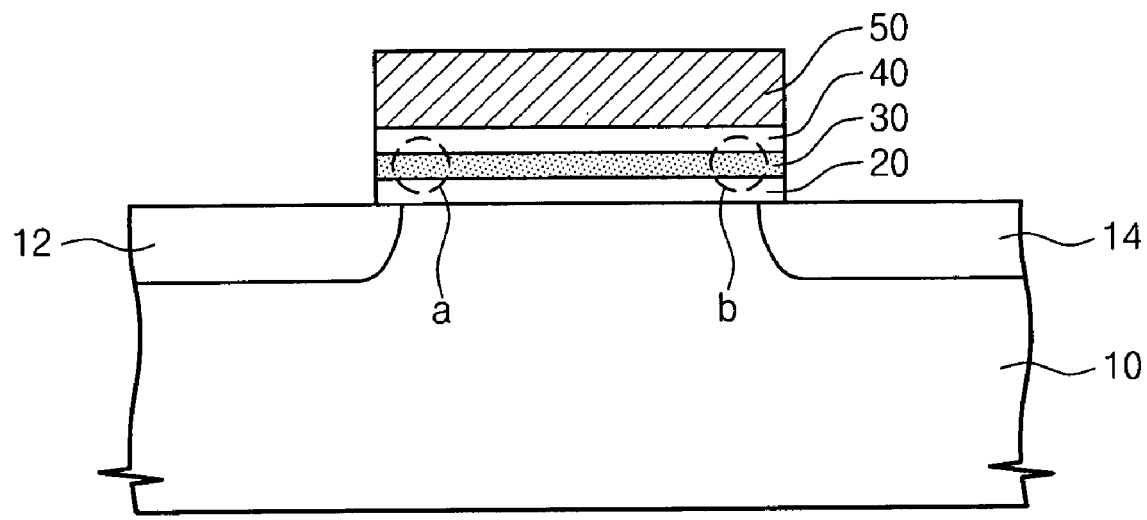
FIG. 1 illustrates a conventional non-volatile memory device.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully hereinafter with reference to the accompanying drawings, in which example embodiments are shown. Example embodiments, however, may be embodied in many different forms and should not be construed as limited to the embodiments set forth herein. Rather, these embodiments are provided so that this disclosure will be thorough and complete, and will fully convey the scope of example embodiments to those skilled in the art. Any element in a claim that does not explicitly state "means for" performing a specified function, or "step for" performing a specific function, may not be interpreted as a "means" or "step" clause as specified in 35 U.S.C. §112, paragraph 6. In particular, the use of "step of" in the claim herein may not be intended to invoke the provisions of 35 U.S.C. §112, paragraph 6.

In the drawings, the thicknesses of layers and regions are exaggerated for clarity. It will also be understood that when a layer may be referred to as being "on" another layer or substrate, it may be directly on the other layer or substrate, or intervening layers may also be present. Like reference numbers refer to like elements throughout. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
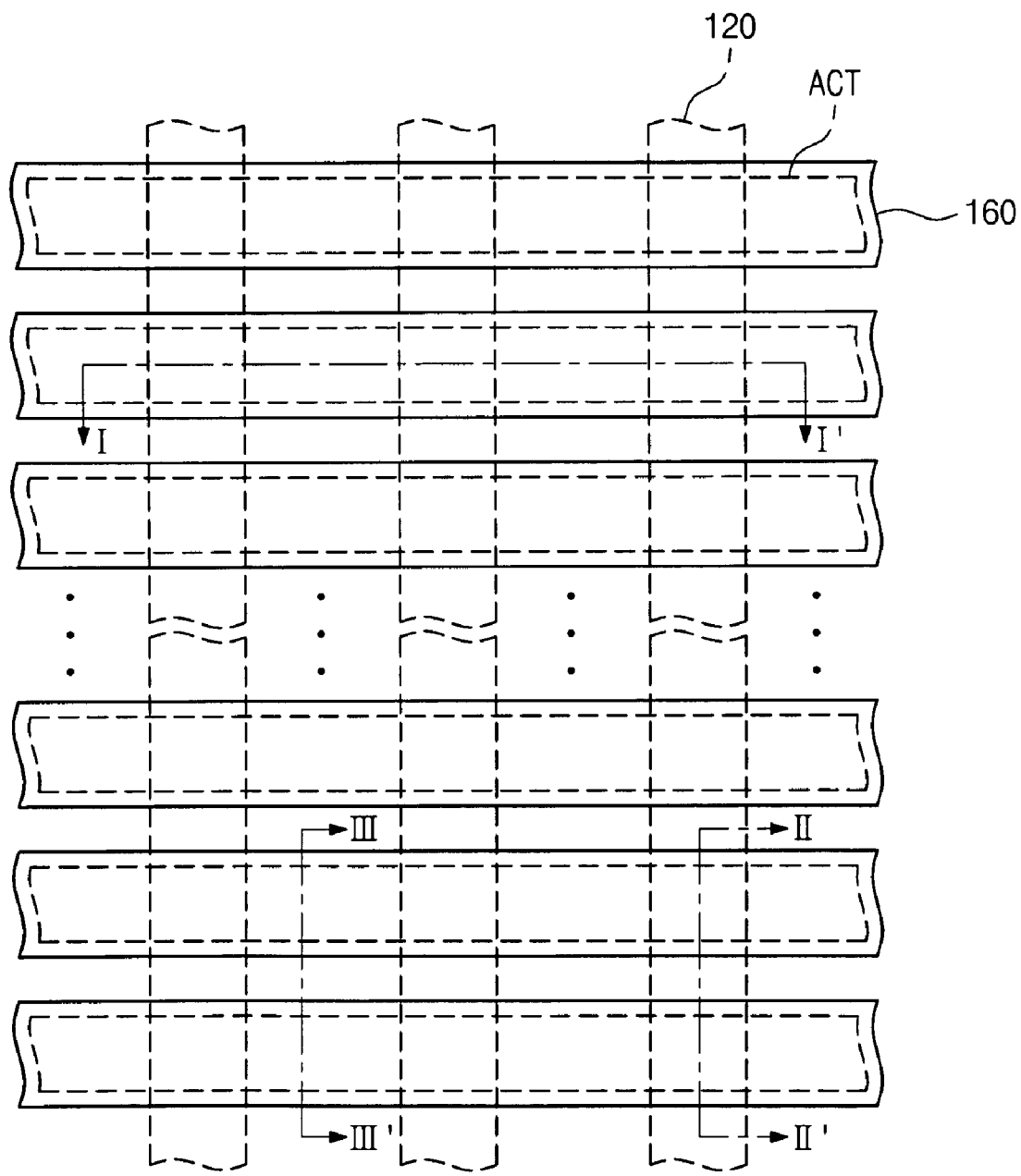
Figure 3:
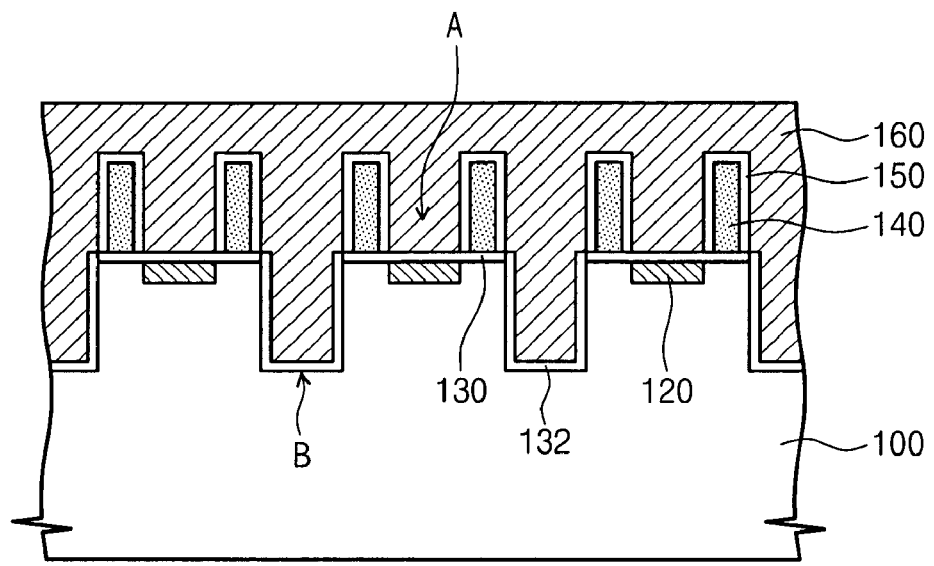
Figure 4:
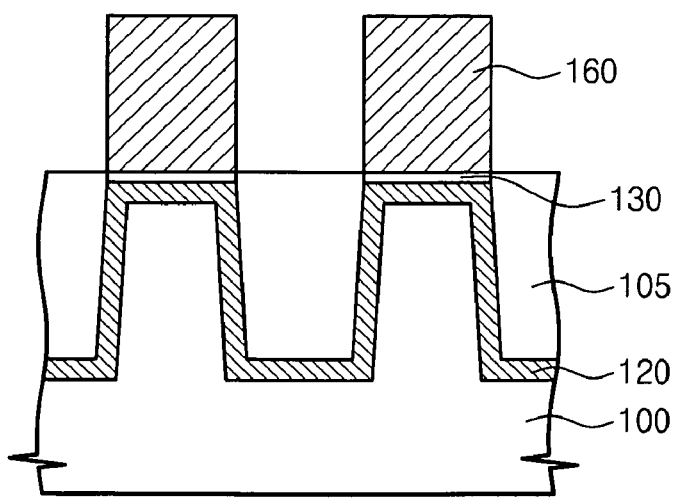
Figure 5:
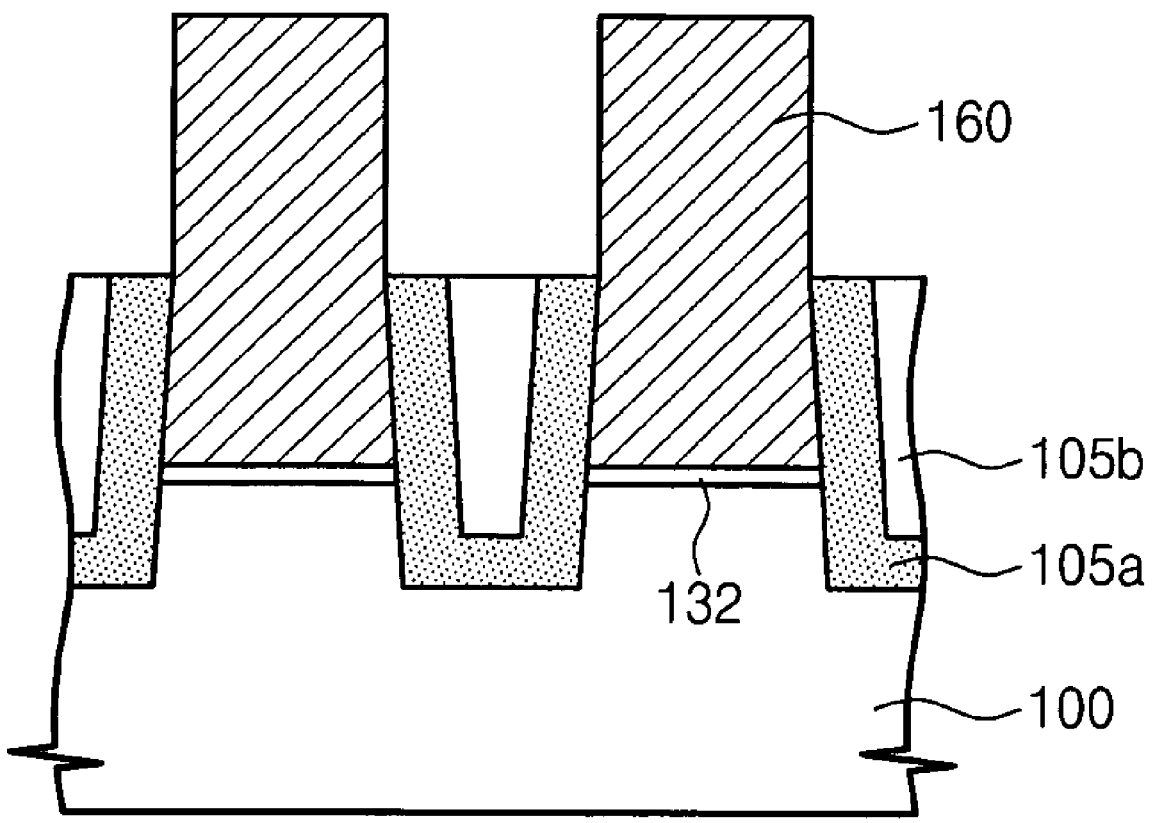

FIG. 2 is a plan view illustrating a cell array of a non-volatile memory device according to example embodiments. FIGS. 3, 4 and 5 are cross-sectional views cut along lines I-I', II-II' and III-III' of FIG. 2. Referring to FIGS. 2 to 5, an active region ACT may be arrayed in a semiconductor substrate 100 in a first direction. Bit lines 120 may be disposed in the semiconductor substrate 100 in a second direction crossing over the active region ACT. In the first direction, word lines 160 covering the active region ACT may be arrayed. Charge storage patterns 140 may be interposed between the word lines 160 and the action regions ACT. The charge storage patterns 140 may include silicon nitride or silicon oxide.

The charge storage patterns 140 may be disposed on both edges of the bit lines in pairs 120. A pair of charge storage patterns 140 may be spaced apart from each other by the word lines 160. In other words, the charge storage patterns 140 may be spaced apart from each other by portions A of the word lines 160 protruding towards the semiconductor substrate 100, thereby interference between the charge storage patterns 140 may be decreased.

The semiconductor substrate 100 may have recess region B between the bit lines 120. The word lines 160 may extend into the recess region B. In the recess region B, a gate insulation layer 132 may be disposed between the semiconductor substrate 100 and the word lines 160. The respective charge storage patterns 140 may be disposed on the semiconductor substrate 100 between the recess region B and the bit lines 120. The short channel effect may be decreased by the recess region B.

A tunnel insulation layer 130 may be interposed between the word lines 160 and bit lines 120, and between the semiconductor substrate 100 and charge storage patterns 140. A blocking insulation layer 150 may be interposed between the charge storage patterns 140 and word lines 160. The blocking insulation layer 150 may include aluminum oxide, hafnium oxide, zirconium oxide or hafnium-zirconium oxide.

The bit lines 120 may be in contact with bottom surfaces and sidewalls of the device isolation layer 105 and bottom surfaces of the tunnel insulation layers 130. The bit lines 120 may be ion-implanted conductive areas in the semiconductor substrate 100. The bit lines 120 may be a metal silicide layer. The device isolation layer 105 in contact with the bit lines 120 may include silicon oxide, and the device isolation layer 105 not in contact with the bit lines 120 may include first insulation layers 105a and second insulation layers 105b. The first insulation layer 105a may be made of silicon nitride, and the second insulation layer 105b may be made of silicon oxide.

The non-volatile memory device may be capable of storing 2-bit data per memory cell. The bit lines 120 may function as a source or a drain. A program operation of the non-volatile memory device may be performed using a hot electron implantation method, and an erase operation may be performed using a hot hole implantation method. Also, after the program operation of the device is performed by using the hot electron implantation, the erase operation may be performed by using a Fowler-Nordheim tunneling method.

Referring to FIGS. 6a to 12c, a method of forming a non-volatile memory device will be described according to example embodiments. FIGS. 6a to 12a are cross-sectional views cut along line I-I' of FIG. 2, FIGS. 6b to 12b are cross-sectional views cut along line II-II' of FIG. 2, and FIGS. 6b to 12b are cross-sectional views cut along line III-III' of FIG. 2, respectively.

Figure 6A:
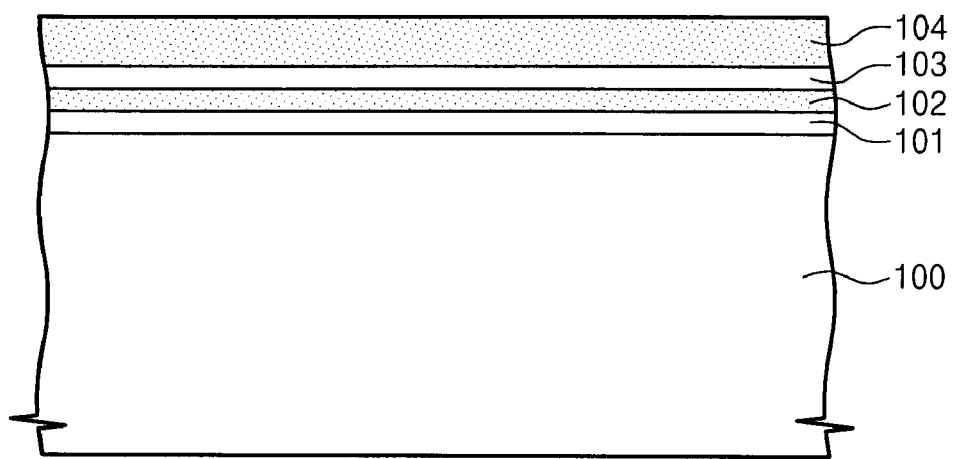
Figure 6B:
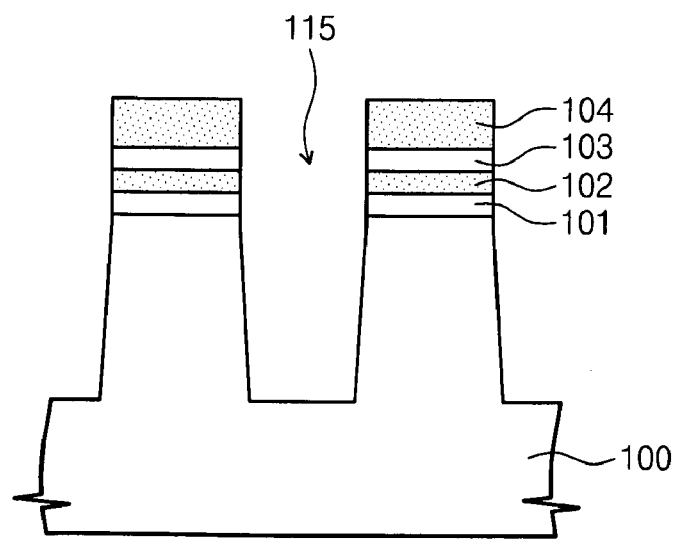
Figure 6C:
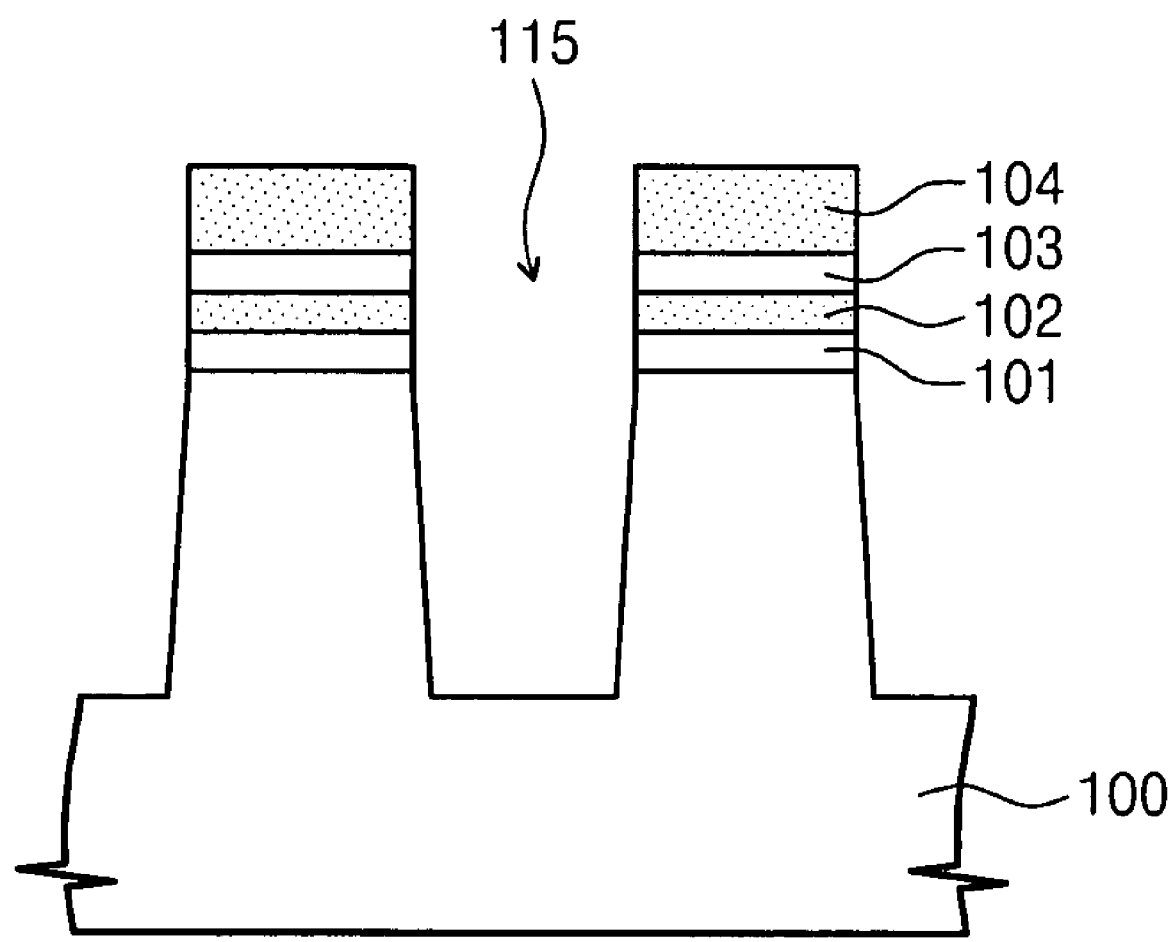

Referring to FIGS. 6a to 6c, a first pad oxide layer 101, a first mask layer 102, a second pad oxide 103, and a second mask layer 104 may be formed on the semiconductor substrate 100. The first and second pad oxide layers 101 and 103 may be made of silicon oxide. The first and second mask layer 102 and 104 may be made of silicon nitride. An etch process may be performed using the first and second pad oxide layers 101 and 103 and the first and second mask layers 102 and 104 as masks, to form a trench 115 in the semiconductor substrate 100 in the first direction.

Figure 7A:
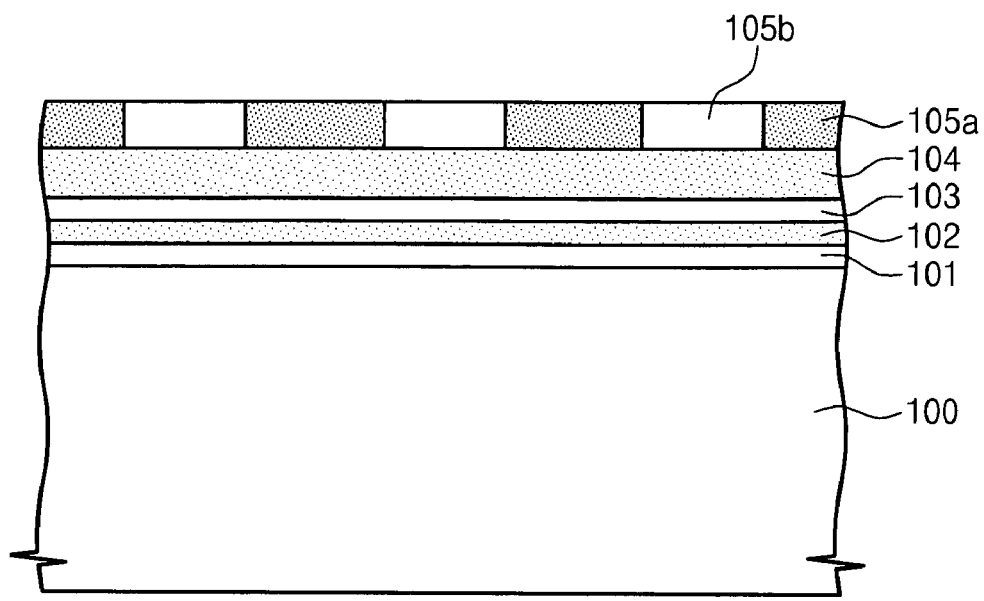
Figure 7B:
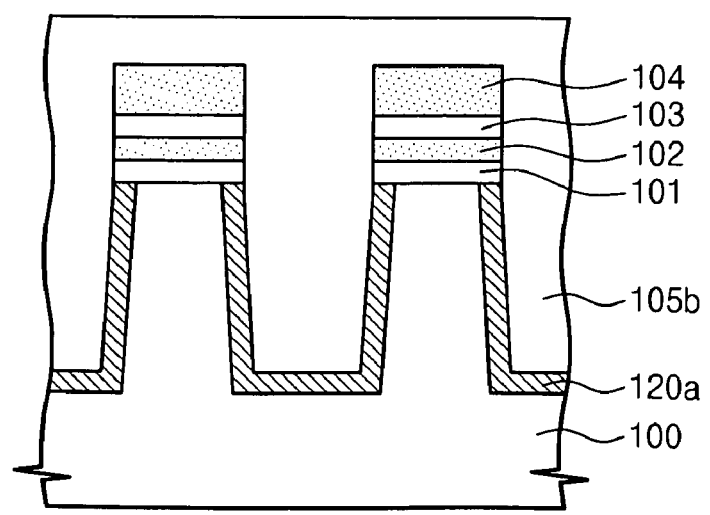
Figure 7C:
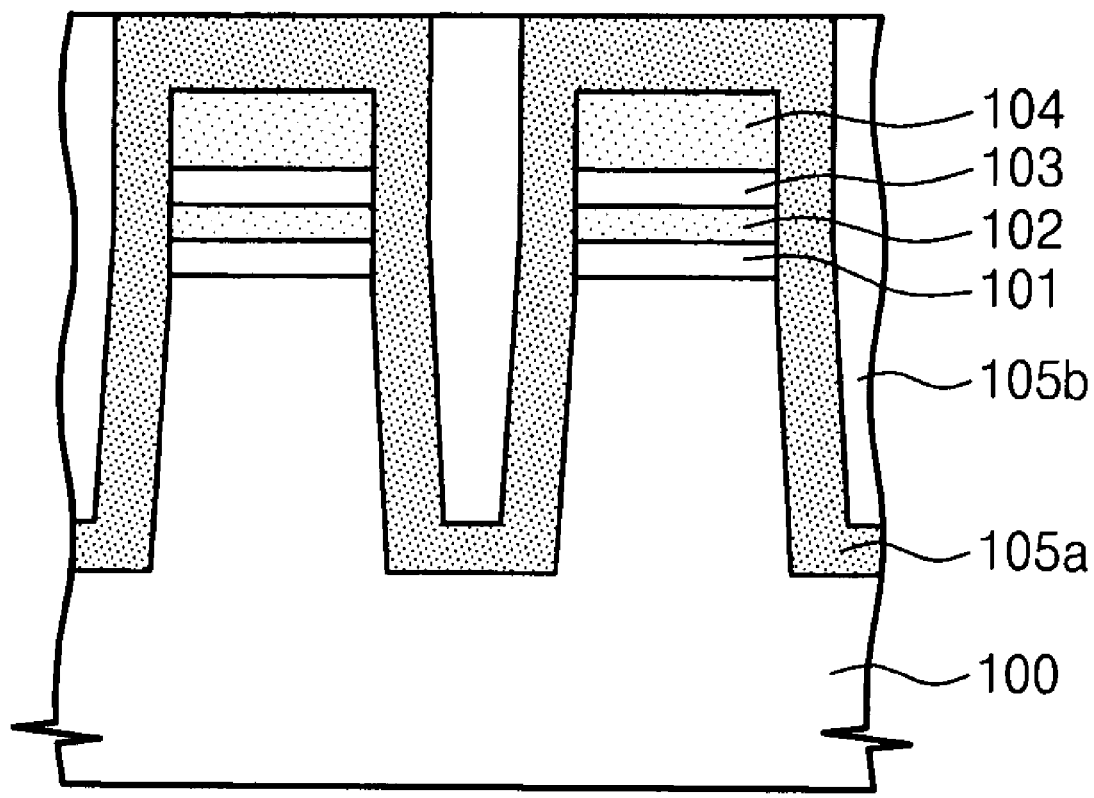
Figure 8A:
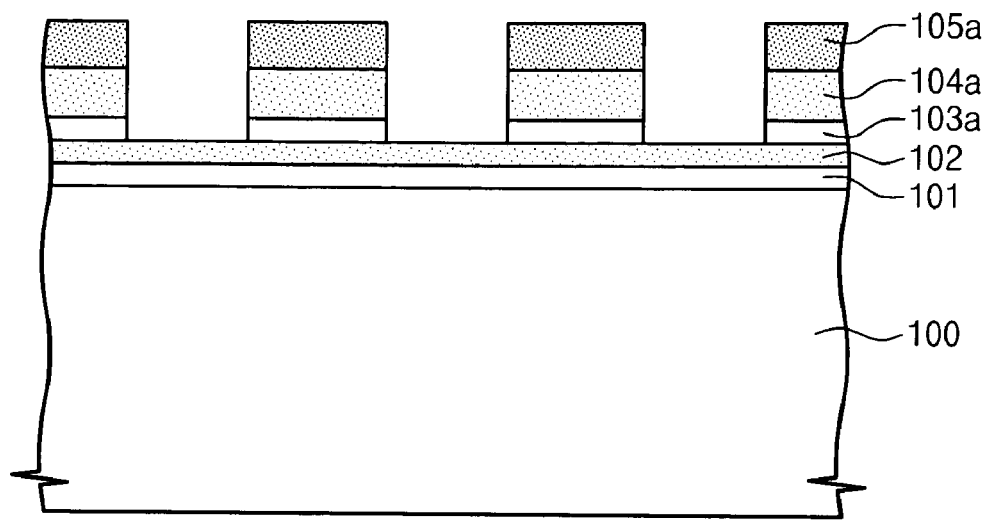
Figure 8B:
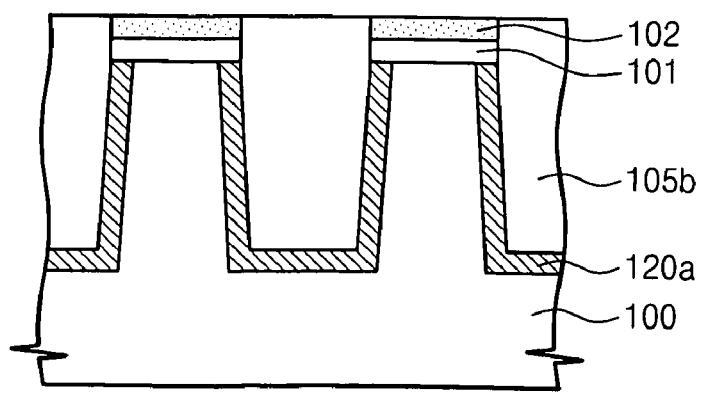
Figure 8C:
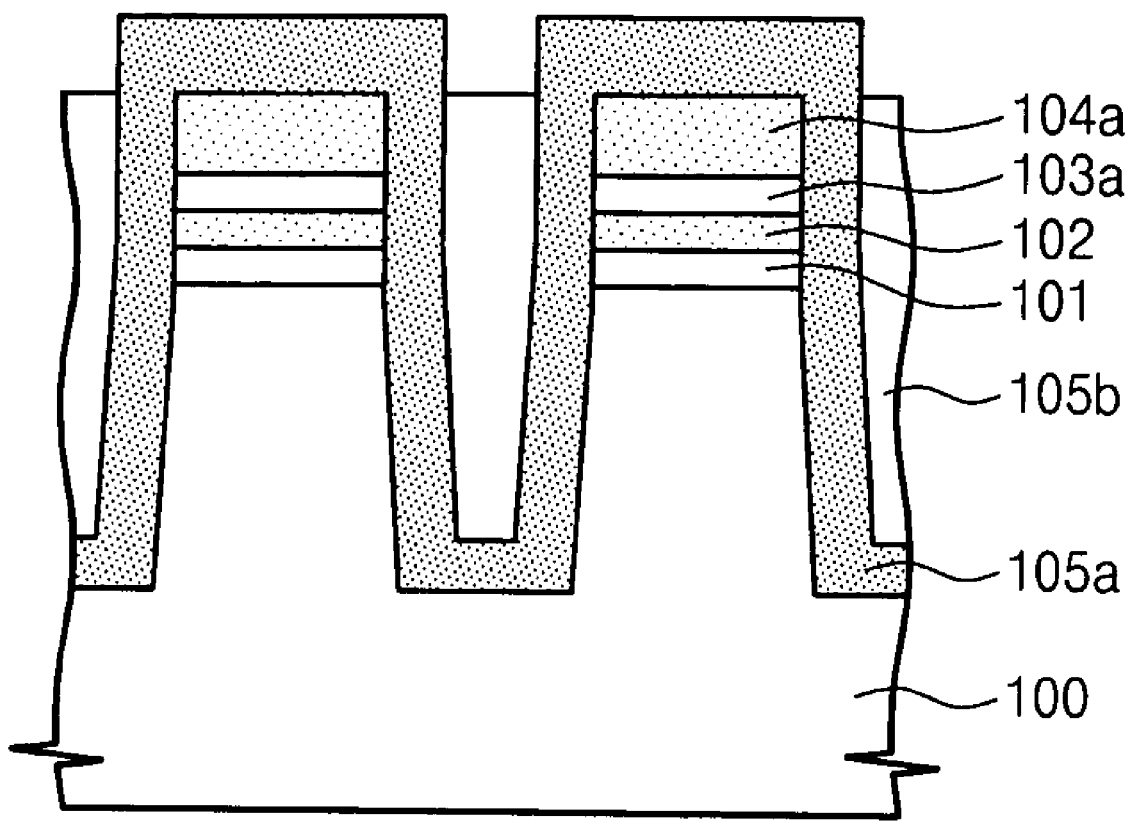

Referring to FIGS. 7a to 7c, mask patterns 105a may be formed in the second direction crossing over the first direction. An ion implantation process may be performed using the mask patterns 105a as mask, to form preliminary bit lines 120a on sidewalls and bottom surface of the trenches 115. Alternatively, the preliminary bit lines 120a may form the mask pattern 105a in the second direction, may form a metal layer covering the trenches 115, and may perform an annealing process to form a metal silicide layer. The preliminary bit lines may also remove a non-reactive metal layer (not shown). After the preliminary bit lines 120a are formed, an insulation layer 105b, which fills the trenches 115, may be formed. The mask pattern 105a may include silicon nitride, and the insulation layer 105b may include silicon oxide. Referring to FIGS. 8a to 8c, an etch process may be performed on the second mask layer 104 and the second pad oxide layer 103 using the mask pattern 105a as mask. The second mask pattern 104a and the second pad oxide layer pattern 103a may be formed.

Figure 9A:
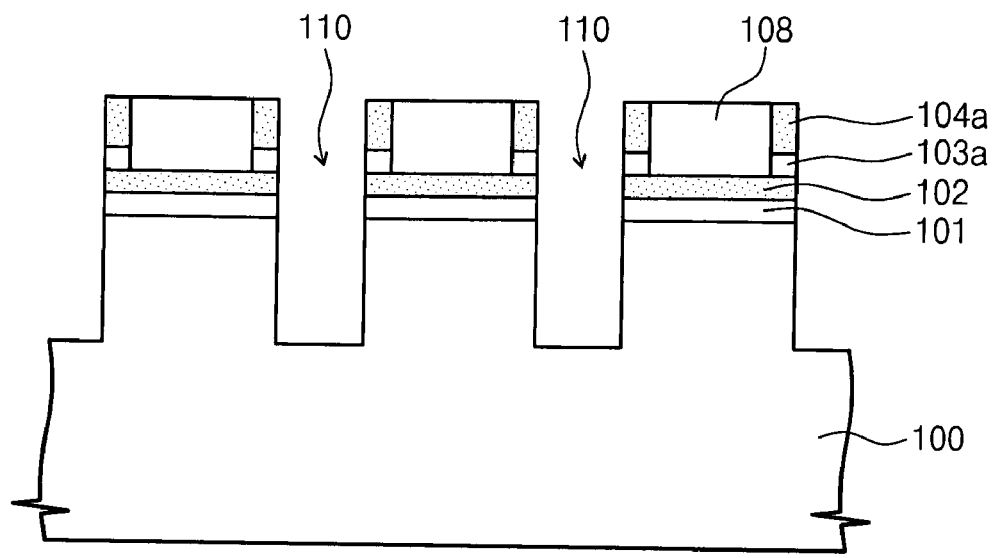
Figure 9B:
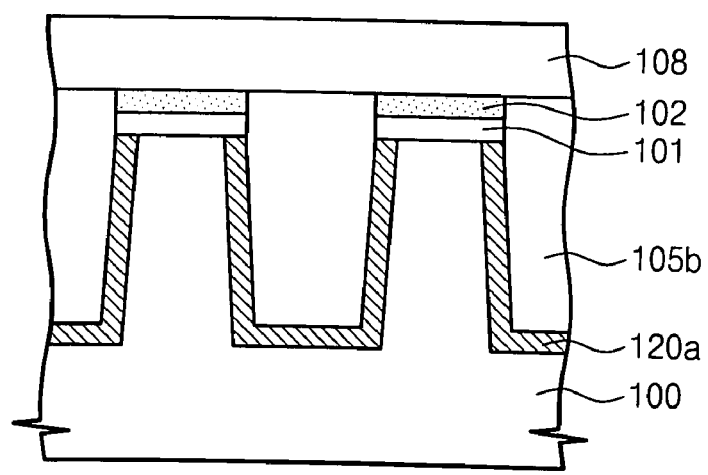
Figure 9C:
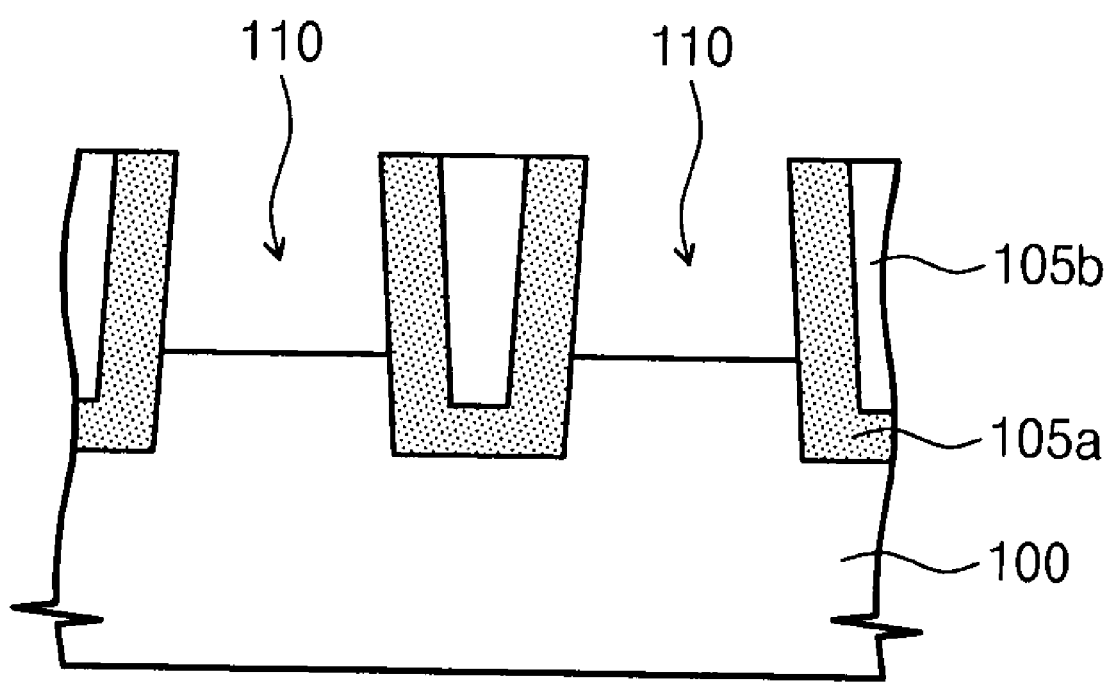

Referring to FIGS. 9a to 9c, after the mask pattern 105a is removed, a third mask 108 between the second mask pattern 104a and second pad oxide layer pattern 103a may be filled. Recess regions 110 may be formed in the second direction. The recess region 110 may function as transistor channels which prevent or reduce the short channel effect.

Figure 10A:
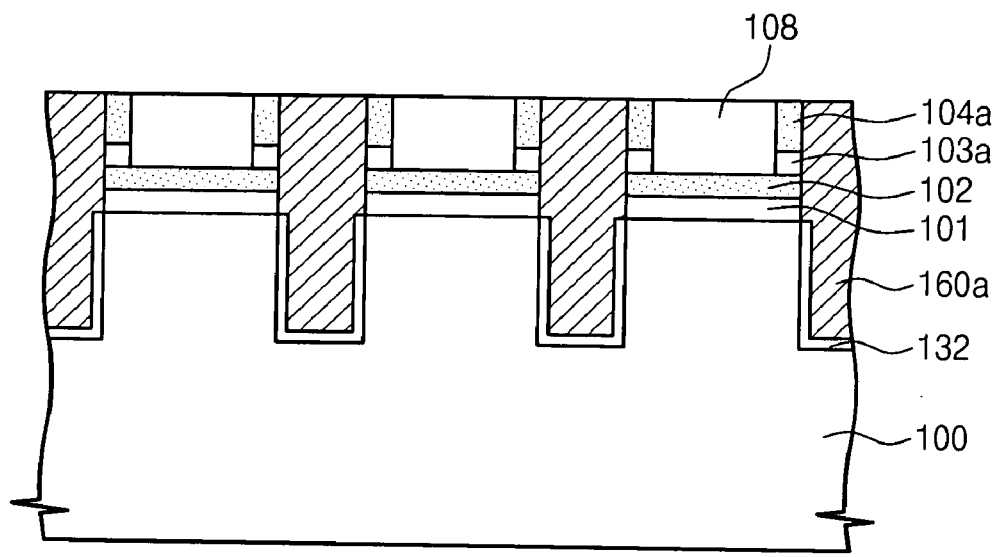
Figure 10B:
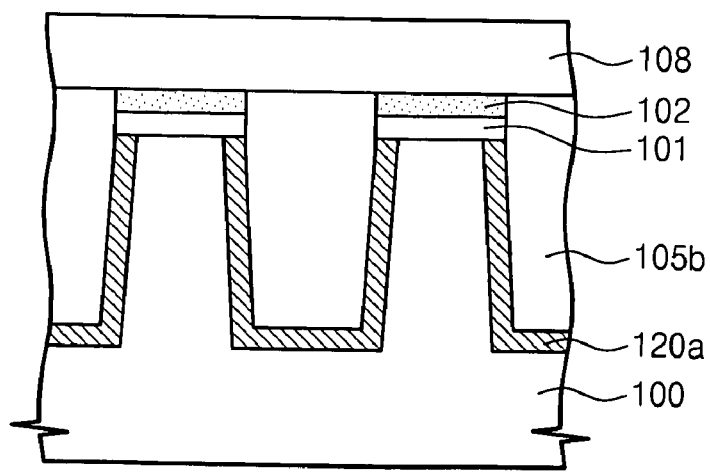
Figure 10C:
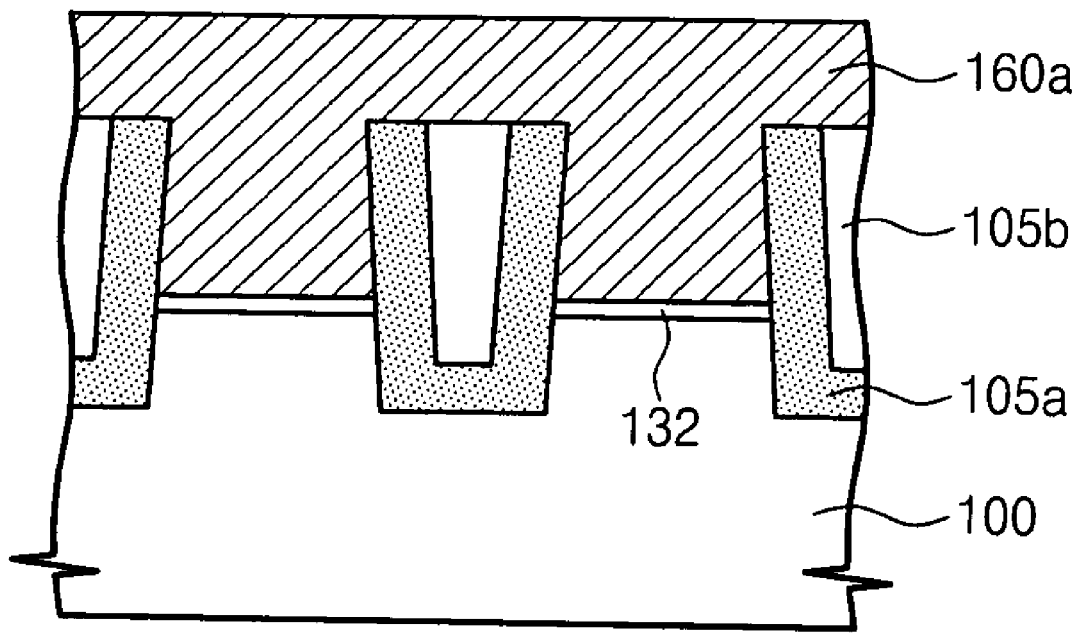

Referring to FIGS. 10a to 10c, an annealing process may be performed on sidewalls and bottom surfaces of the recess region 110, to form gate insulation layers 132. Preliminary word lines 160a which fill the recess region 110 may be formed. The preliminary word lines 160a may be made of polysilicon or tantalum. The preliminary word lines 160a may be formed by forming conductive layers filling the recess region 110, and performing a planarization process using the third mask pattern 108 as stopping layer.

Figure 11A:
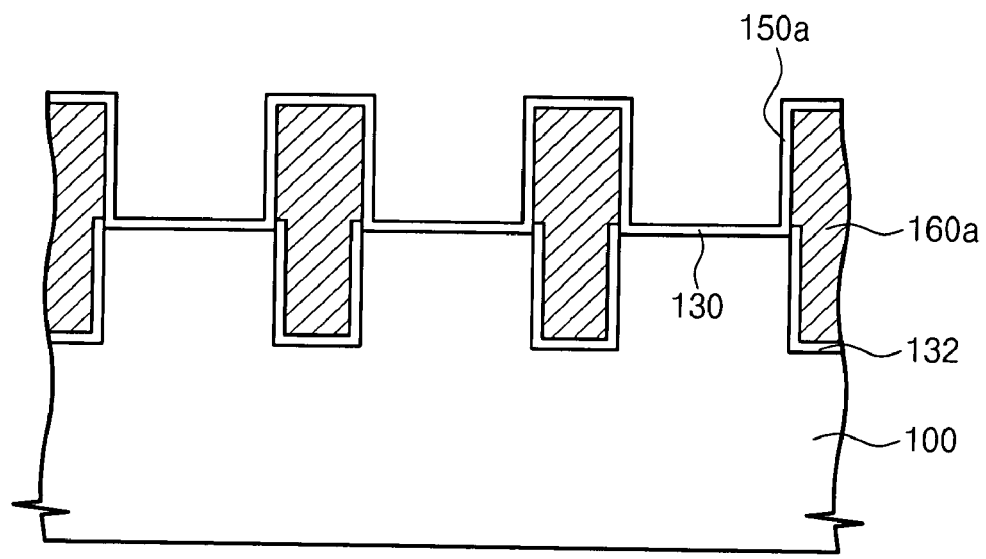
Figure 11B:
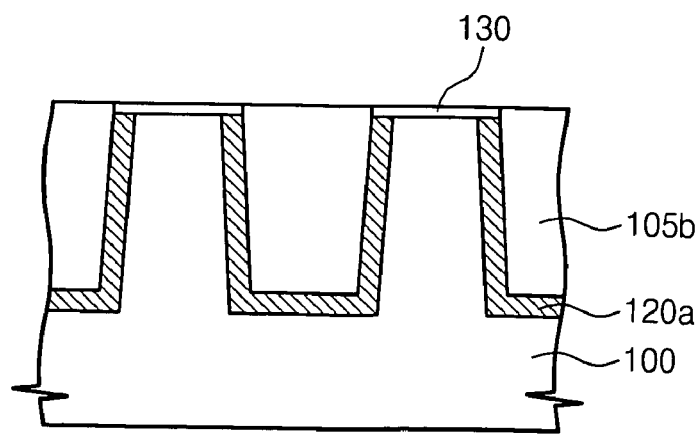
Figure 11C:
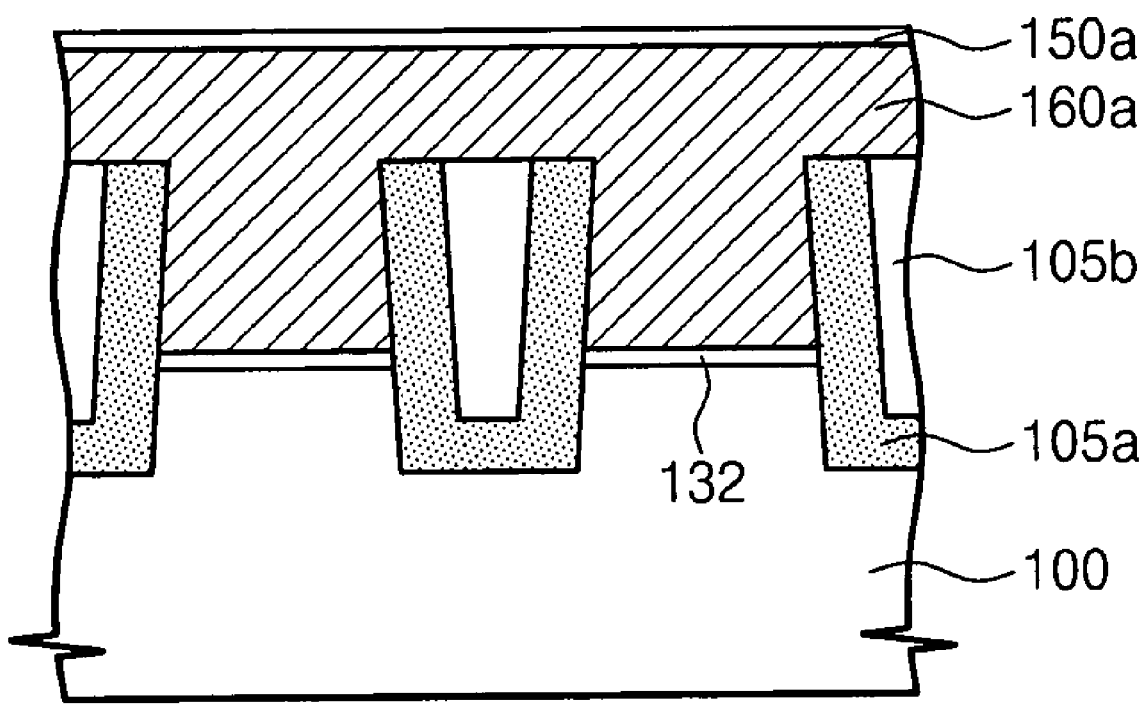

Referring to FIGS. 11a to 11c, the third mask pattern 108, second mask pattern 104a, second pad oxide layer pattern 103a, second mask layer 102, and first pad oxide layer 101 may be removed to expose the semiconductor substrate 100. Tunnel insulation layers 130 may be formed on the semiconductor substrate 100. A first blocking insulation layer 150a, which covers the preliminary word lines 160a, may be formed. The first blocking insulation layer 150a may be made of silicon oxide, aluminum oxide or a high-k dielectric. The tunnel insulation layers 130 and the first blocking insulation layer 150a may be simultaneously formed using a thermal oxidation process or a chemical vapor deposition (CVD) process.

Figure 12A:
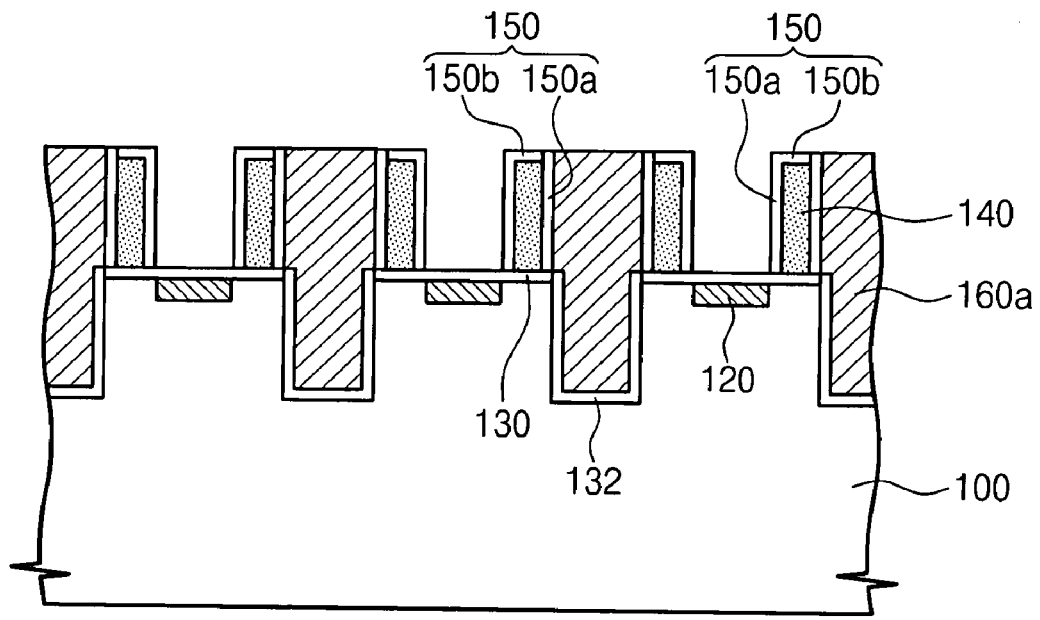
Figure 12B:
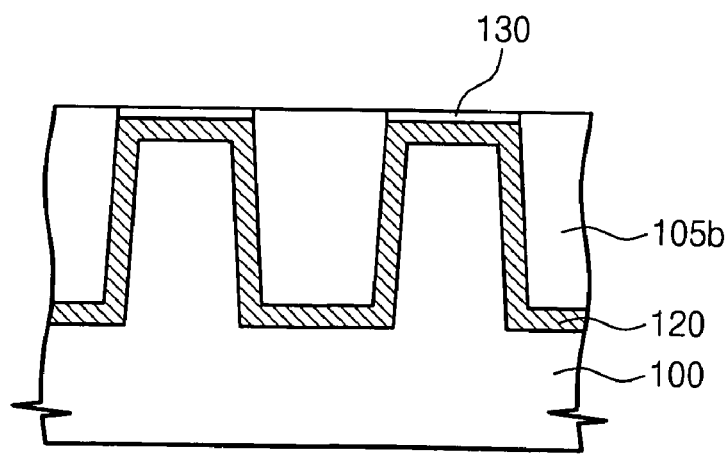
Figure 12C:
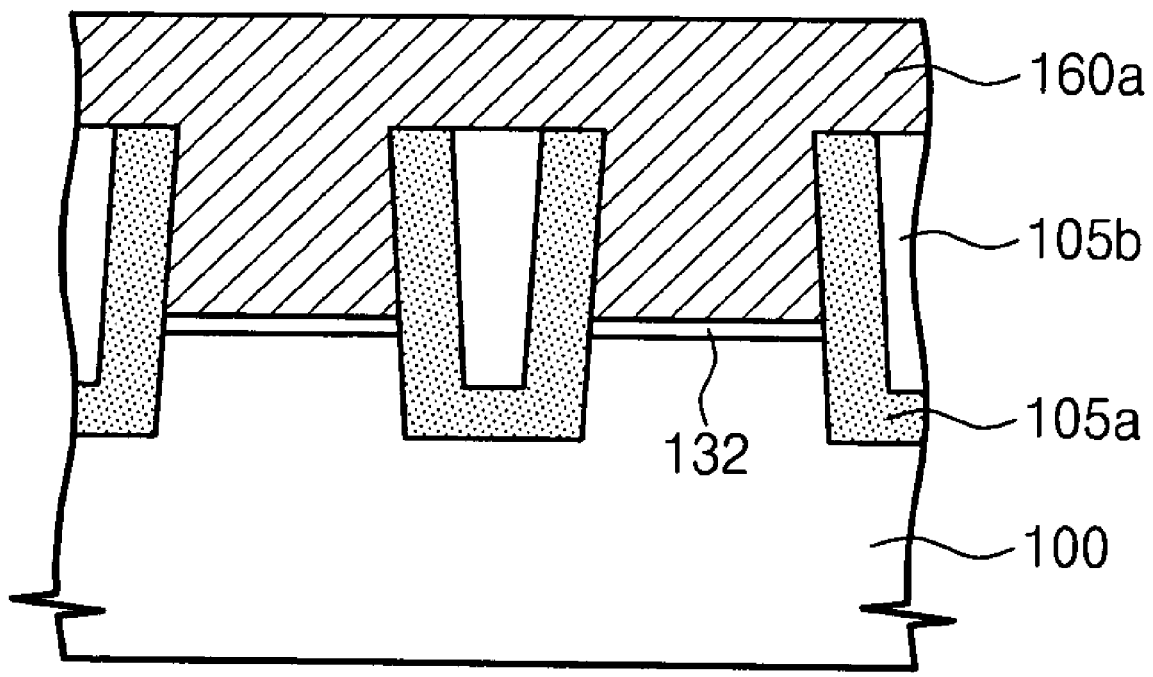

Referring to FIGS. 12a to 12c, charge storage layers, which cover the preliminary word lines 160a, may be formed. A planarization process may be performed on the charge storage layers to expose top surfaces of the preliminary word lines 160a. Charge storage patterns 140 may be formed by patterning the charge storage layers. Second blocking insulation layers 150b may be formed on the charge storage patterns 140. As a result, the blocking insulation layers 150 may include the first blocking insulation layers 150a and second blocking insulation layers 150b. The second blocking insulation layers 150b may be formed by performing a radical oxidation process or an oxygen ion implantation process on the charge storage patterns 140.

An ion implantation process may be performed on the semiconductor substrate 100 using the charge storage patterns 140 and preliminary word lines 160a. The bit lines 120 including the preliminary bit lines 120a may be formed. Forming the bit lines 120 may include connecting the preliminary bit lines 120a in the second direction. The device isolation layer in contact with the bit lines 120 may include the insulation layer 105b, and the device isolation layer not in contact with the bit lines 120 may include the mask patterns 105a on sidewalls and bottom surface of the trenches 115, and insulation layers 105b on the mask patterns 105a.

Figure 13A:
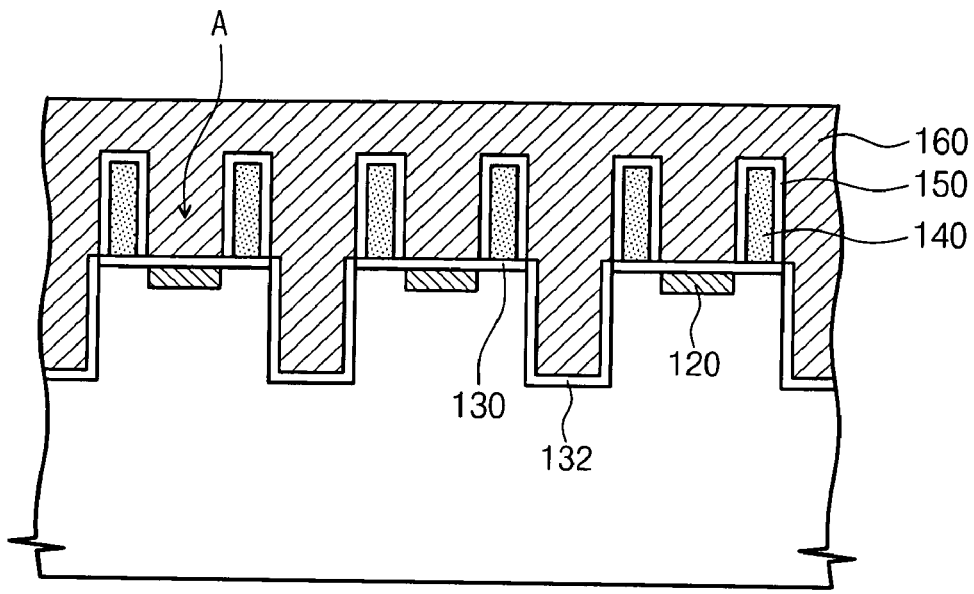
Figure 13B:
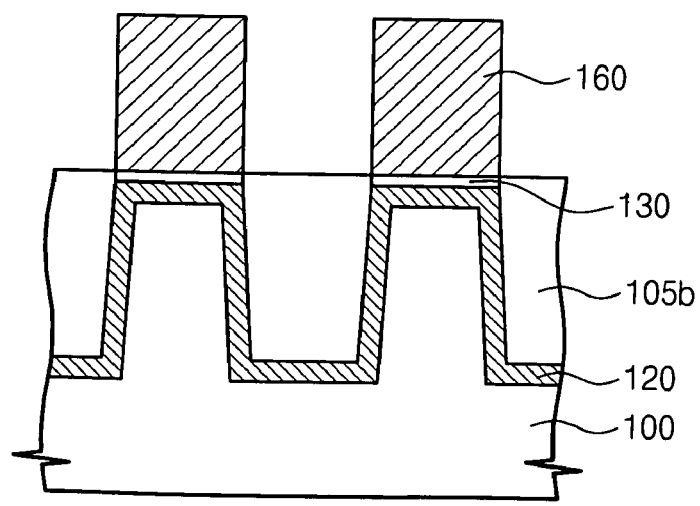
Figure 13C:
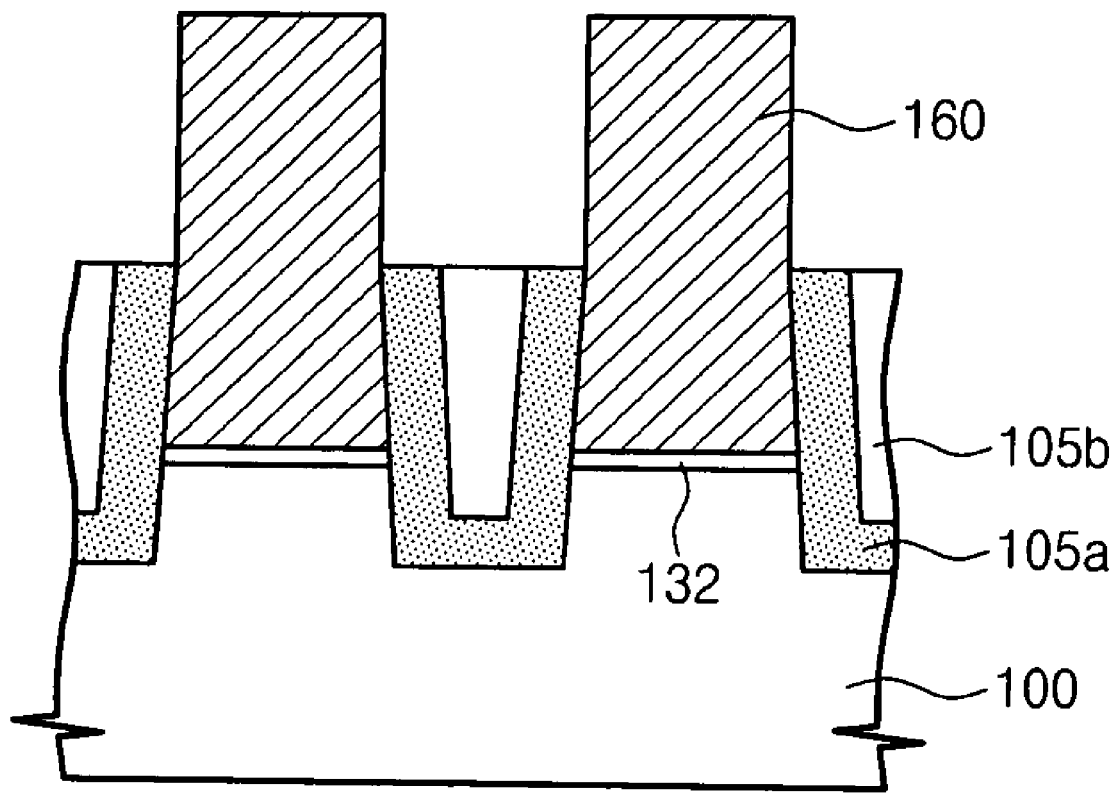

Referring to FIGS. 13a to 13c, word lines 160, which cross over the bit lines 120, may be formed. Forming the word lines 160 may include forming a conductive layer (not shown) covering the charge storage patterns 140 and the preliminary word lines 160a, forming an insulation pattern (not shown) extending in the first direction on the conductive layer, and etching the conductive layer, charge storage patterns 140 and preliminary word lines 160a using the insulation pattern as mask. The word lines 160 may be disposed between a pair of charge storage patterns 140 of the bit lines 120. Accordingly, interference may occur less in the proximate charge storage patterns 140.

According to example embodiments, recess regions may be provided on semiconductor substrates. The short channel effect of the non-volatile memory devices may be decreased by these recess regions. As a pair of charge storage patterns, which are disposed on both ends of the bit lines, are spaced apart from each other by the word lines, interference may be decreased. Accordingly, reliability of the non-volatile memory device may be enhanced.

Although example embodiments have been described in connection with the present application illustrated in the accompanying drawings, example embodiments are not limited thereto. It will be apparent to those skilled in the art that various substitution, modifications and changes may be thereto without departing from the scope and spirit of example embodiments.

What is claimed is:

1. A non-volatile memory device comprising:
    a device isolation layer extending in a first direction, the device isolation layer defining an active region in a semiconductor substrate;
    a plurality of bit lines in the semiconductor substrate, the bit lines extending in a second direction which intersects the first direction;
    a plurality of word lines extending in the first direction, the word lines covering the active region; and
    a plurality of charge storage patterns between the word lines and the active region,
    wherein the charge storage patterns are in pairs on both edges of the bit lines, and a pair of the charge storage patterns are spaced apart from each other by the word lines.

2. The non-volatile memory device as claimed in claim 1, further comprising:
a tunnel insulation layer between the word lines and the bit lines, and between the semiconductor substrate and the charge storage patterns.

3. The non-volatile memory device as claimed in claim 2, wherein the bit lines are in contact with bottom surfaces and sidewalls of the device isolation layer, and a bottom surface of the tunnel insulation layer.

4. The non-volatile memory device as claimed in claim 3, wherein the bit lines are conductive portions of the semiconductor substrate in which impurity ions are implanted.

5. The non-volatile memory device as claimed in claim 3, wherein the bit lines include a metal silicide layer.

6. The non-volatile memory device as claimed in claim 2 further comprising:
a blocking insulation layer between the charge storage patterns and the word lines, the blocking insulation layers covering the charge storage patterns.

7. The non-volatile memory device as claimed in claim 1, wherein the semiconductor substrate includes a recess region between the bit lines, and the word lines extend in the recess region.

8. The non-volatile memory device as claimed in claim 7, wherein the charge storage patterns are on the semiconductor substrate between the recess region and the bit lines.

9. The non-volatile memory device as claimed in claim 7, further comprising:
a gate insulation layer between portions of the word lines extending in the recess region and the semiconductor substrate.

10. The non-volatile memory device as claimed in claim 1, wherein the device isolation layer in contact with the bit lines includes silicon oxide layers, and the device isolation layer not in contact with the bit lines includes a silicon nitride layer on top of the semiconductor substrate, and a silicon oxide layer on top of the silicon nitride layer.

* * * * *